United States Patent [19]

Marz

[11] Patent Number: 5,036,291
[45] Date of Patent: Jul. 30, 1991

[54] ON CHANNEL AGILE FM DEMODULATOR

[75] Inventor: Daniel Marz, Dresher, Pa.

[73] Assignee: General Instrument Corporation, New York, N.Y.

[21] Appl. No.: 523,057

[22] Filed: May 11, 1990

[51] Int. Cl.⁵ .............................................. H03D 3/00
[52] U.S. Cl. ..................................... 329/325; 331/23; 331/25
[58] Field of Search ................... 331/23, 25; 329/325; 358/188, 191.1, 195.1

[56] References Cited

U.S. PATENT DOCUMENTS

| | | | |
|---|---|---|---|
| 3,927,284 | 12/1975 | Jezo | 331/17 X |
| 4,077,016 | 2/1978 | Sanders et al. | 329/325 X |
| 4,292,594 | 9/1981 | David et al. | 331/23 X |
| 4,633,316 | 12/1986 | Burke et al. | 455/260 X |

Primary Examiner—Robert J. Pascal
Attorney, Agent, or Firm—Barry R. Lipsitz

[57] ABSTRACT

An on channel frequency agile PLL demodulator is provided using a precise and stable oscillator, such as a VCXO having its output frequency variable over a limited range. The output of the oscillator is multiplied by a multiplication factor to produce a mixing frequency. The multiplication factor scales the limited range of the oscillator to produce a proportionate mixing frequency deviation. A frequency synthesizer is used to enable the demodulator to detect signals on different channels. In one embodiment, the output of the frequency synthesizer is mixed with the scaled oscillator output to provide a mixing frequency having a fixed deviation for all channels.

20 Claims, 3 Drawing Sheets

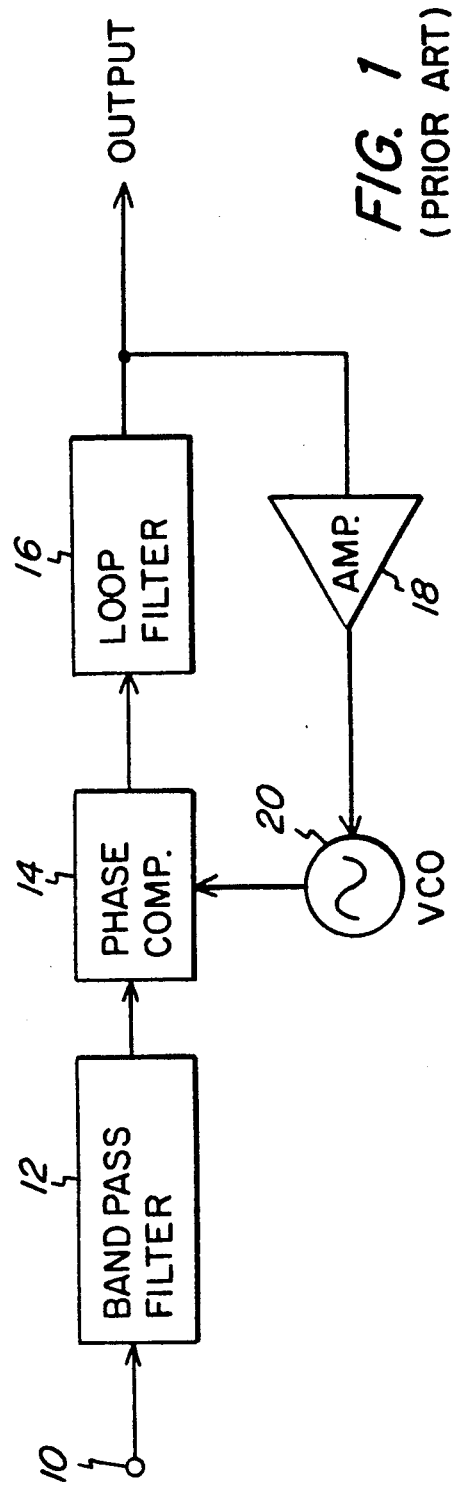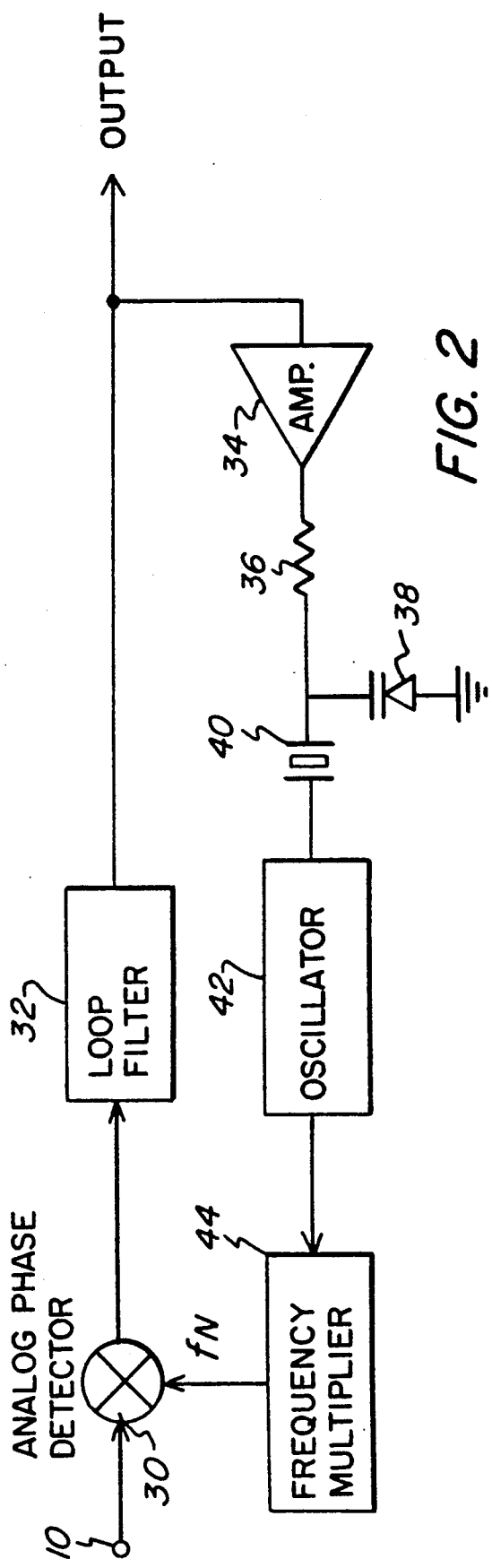

ON CHANNEL AGILE FM DEMODULATOR

BACKGROUND OF THE INVENTION

The present invention relates to RF receivers, and more particularly to an agile FM demodulator that can be used for detecting data transmitted over a cable television network.

Cable television systems supply a plurality of carriers within a predefined bandwidth. The carriers include television program signals assigned to specific channels, digital data (typically on an FM data path) for use in controlling converter boxes supplied by the cable television company, and may also include separate audio or information channel signals. The traditional approach for detecting and demodulating individual carrier signals is to use a superheterodyne receiver. Such a receiver provides an intermediate frequency ("IF") filter to select a desired carrier and reject all others.

Phase lock loop ("PLL") circuits can be used to detect a signal on a channel. A complicated tuning system is required, however, to provide a frequency agile PLL demodulator. In such applications, a voltage controlled oscillator ("VCO") used in the PLL has to cover the entire desired frequency spectrum. Without a tracking input filter, the output of the phase detector might result in the VCO locking onto an undesired channel. This can happen even with a tracking filter if the interfering channel is substantially stronger than the desired one. Since the separation between carriers is small in television applications, it is difficult and expensive to manufacture suitable tracking filters for use with a PLL detector.

It would be advantageous to provide a PLL circuit for detecting channel signals without the need to provide a tracking input filter. The present invention provides such apparatus.

SUMMARY OF THE INVENTION

In accordance with the present invention, a phase lock loop demodulator is provided comprising a phase detector having a first input for receiving a signal, a second input for receiving a mixing frequency, and an output. A precise and stable oscillator outputs a frequency variable over a limited range in response to a control signal derived from the phase detector output. Frequency multiplier means multiply the oscillator frequency by a multiplication factor to produce the mixing frequency. The multiplication factor scales the limited range to produce a proportionate mixing frequency deviation.

In a preferred embodiment, the frequency multiplier provides a plurality of selectable multiplication factors. The frequency multiplier can comprise a frequency synthesizer. Each multiplication factor is chosen to produce the mixing frequency necessary to translate a channel signal received at the first input of the phase detector to baseband. A low pass filter can be coupled to the output of the phase detector. The filtered phase detector output is amplified to provide the control signal.

A voltage controlled crystal oscillator, voltage controlled SAW resonator, or voltage controlled ceramic resonator can be used to provide the required precise and stable oscillator frequency.

In another embodiment, a frequency agile phase lock loop demodulator includes a phase detector having a first input for receiving a signal, a second input for receiving a mixing frequency, and an output. Oscillator means provide a precise and stable output frequency variable over a limited range in response to a control signal derived from the phase detector output. A mixer is provided with a first input coupled to receive an oscillator signal produced by the oscillator means, a second input, and an output coupled to the second input of the phase detector. Frequency synthesizer means provide a selected frequency to the second input of the mixer.

Frequency multiplier means coupled between the oscillator means and the first mixer input can be provided to multiply the oscillator output frequency by a fixed multiplication factor. The frequency synthesizer provides a plurality of selectable output frequencies for translating a desired channel signal received at the first phase detector input to baseband. Filter means coupled to the output of the mixer provide a filtered mixing frequency to the second phase detector input.

BRIEF DESCRIPTION OF THE DRAWINGS

FIG. 1 is a block diagram of a prior art phase lock loop circuit;

FIG. 2 is a block diagram of one embodiment of an FM demodulator in accordance with the present invention;

DETAILED DESCRIPTION OF THE INVENTION

Figure 3:
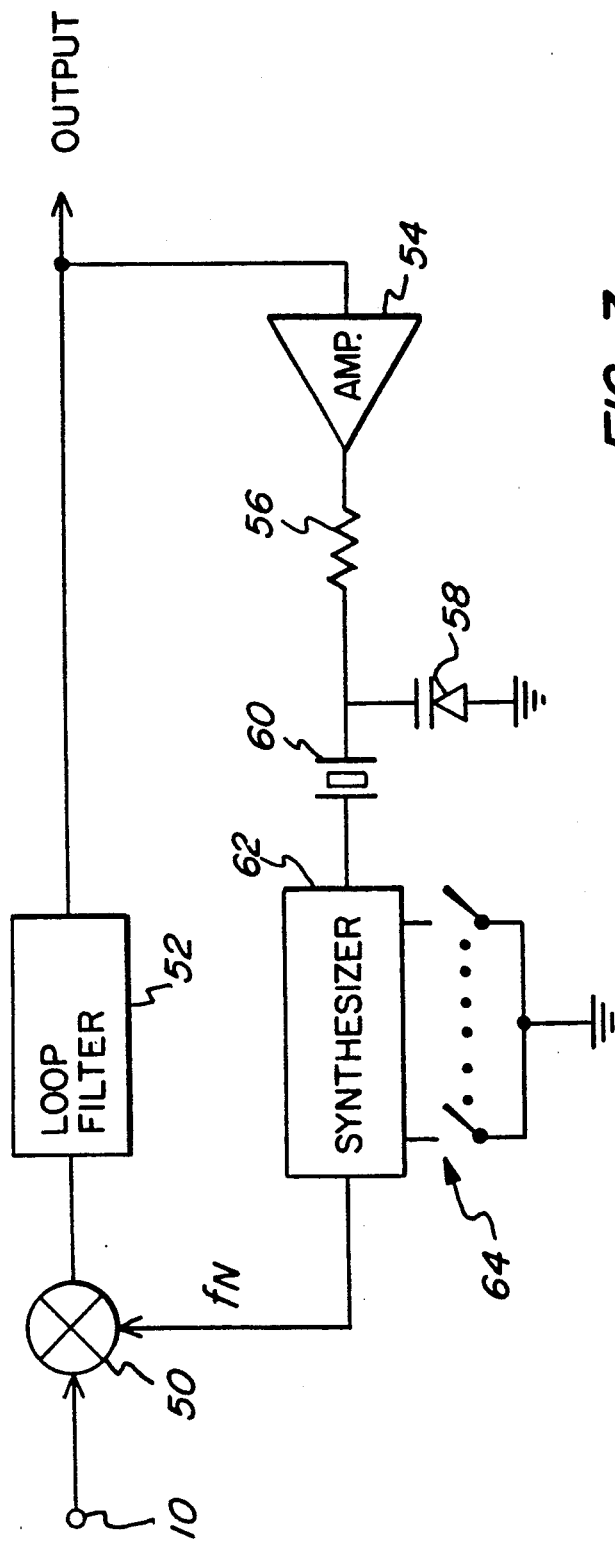
FIG. 3 is a block diagram of an embodiment of an agile FM demodulator in accordance with the present invention.

Phase lock loop circuits are well known. An example of such a circuit is shown in U.S. Pat. No. 4,633,316 which illustrates a cable television remodulator using a PLL circuit. Phase lock loops can also be used to detect the signal on a given channel, as illustrated in FIG. 1. An RF signal is input to terminal 10, and filtered by a bandpass filter 12. The output of bandpass filter 12 is coupled to one input of a phase comparator 14, the other input of which is supplied with a signal having a tuning frequency output by a voltage controlled oscillator 20. The phase comparator compares the signals at its two inputs and develops an error signal as a function of the comparison. The error signal is supplied to a loop filter 16 which removes all but the frequencies of interest. The output of loop filter 16 contains the modulation component of the signal input at terminal 10. This signal is amplified in an amplifier 18, and used to control the frequency of the voltage controlled oscillator 20. In order to detect each of the plurality of channels transmitted in the cable television band, the prior art PLL circuit of FIG. 1 requires a voltage controlled oscillator that can cover the entire desired spectrum. Often, the VCO will lock to an undesired channel, particularly if the interfering channel is substantially stronger than the desired one.

In order to overcome this problem, the present invention provides an on channel FM demodulator using a precise and stable oscillator variable over a limited range in response to a PLL error signal. FIG. 2 illustrates one embodiment of a demodulator in accordance with the present invention. The RF signal spectrum is input at terminal 10, and coupled to a first input of an analog phase detector 30. A second input of phase detector 30 receives a mixing frequency $f_N$ provided by the PLL. Loop filter 32 and amplifier 34 are conventional components as described in connection with FIG. 1. A resistor 36, varactor 38, and crystal 40 are provided for controlling an oscillator 42 to provide a precise and stable output frequency. The combination of resistor 36, varactor 38, crystal 40, and oscillator 42 provide a voltage controlled crystal oscillator ("VCXO") having a precise free running frequency. A frequency multiplier 44 multiplies the frequency output from oscillator 42 to produce the mixing frequency $f_N$ input to phase detector 30.

Crystal 40 fixes oscillator 42 at a precise frequency, with a limited pulling capability that enables the oscillator frequency to be varied over a limited range when the voltage at the junction of resistor 36 and varactor 38 is varied. The limited VCXO pulling capability is multiplied by the multiplication factor of frequency multiplier 44. Thus, for example, if the pulling capability of the VCXO is 2 KHz and the frequency multiplication factor is 8, the combination of the VCXO with frequency multiplier 44 will provide a maximum frequency deviation of 16 KHz. Those skilled in the art will appreciate that the VCXO/multiplier combination can be designed for any particular application to cover the deviation plus frequency errors in the modulator and demodulator.

The output of analog phase detector 30 will contain a DC signal that is proportional to the phase difference between the desired signal and the VCXO output signal. The phase detector output will also include the sum and difference beats between the VCXO frequency and the rest of the signals applied to input terminal 10. Loop filter 32 will attenuate the sum and difference beats to negligible levels. Due to the limited pulling range of the VCXO, the PLL will not lock to an undesired channel. This represents a significant improvement over the prior art circuit of FIG. 1. Analog phase detector 30 is preferably a high quality, linear analog multiplier that does not create intermodulations that would fall on the desired channel.

The embodiment of FIG. 2 can demodulate only one channel. FIG. 3 illustrates an alternate embodiment, in which the demodulator is frequency agile. In the embodiment of FIG. 3, frequency multiplier 44 is replaced by a frequency synthesizer 62. The synthesizer can comprise a standard PLL with a programmable divider which sets the synthesizer's output frequency via switches 64. An example of such a frequency synthesizer is provided in U.S. Pat. No. 3,927,384. Phase detector 50, loop filter 52, amplifier 54, resistor 56, varactor 58, and crystal 60 are equivalent to the corresponding components discussed in connection with FIG. 2. Thus, the embodiment of FIG. 3 differs from that of FIG. 2 primarily in that the demodulator loop can be tuned to any desired channel.

A drawback with the embodiment illustrated in FIG. 3 is that the pulling capability of the synthesizer's output frequency is proportional to the synthesizer division ratio. In other words, $f_N = N \times f_c$, where N is the multiplication factor and $f_c$ is the crystal frequency. In order to limit the deviation of the mixing frequency to a fixed value, two separate frequency sources can be used as illustrated in FIG. 4.

Figure 4:
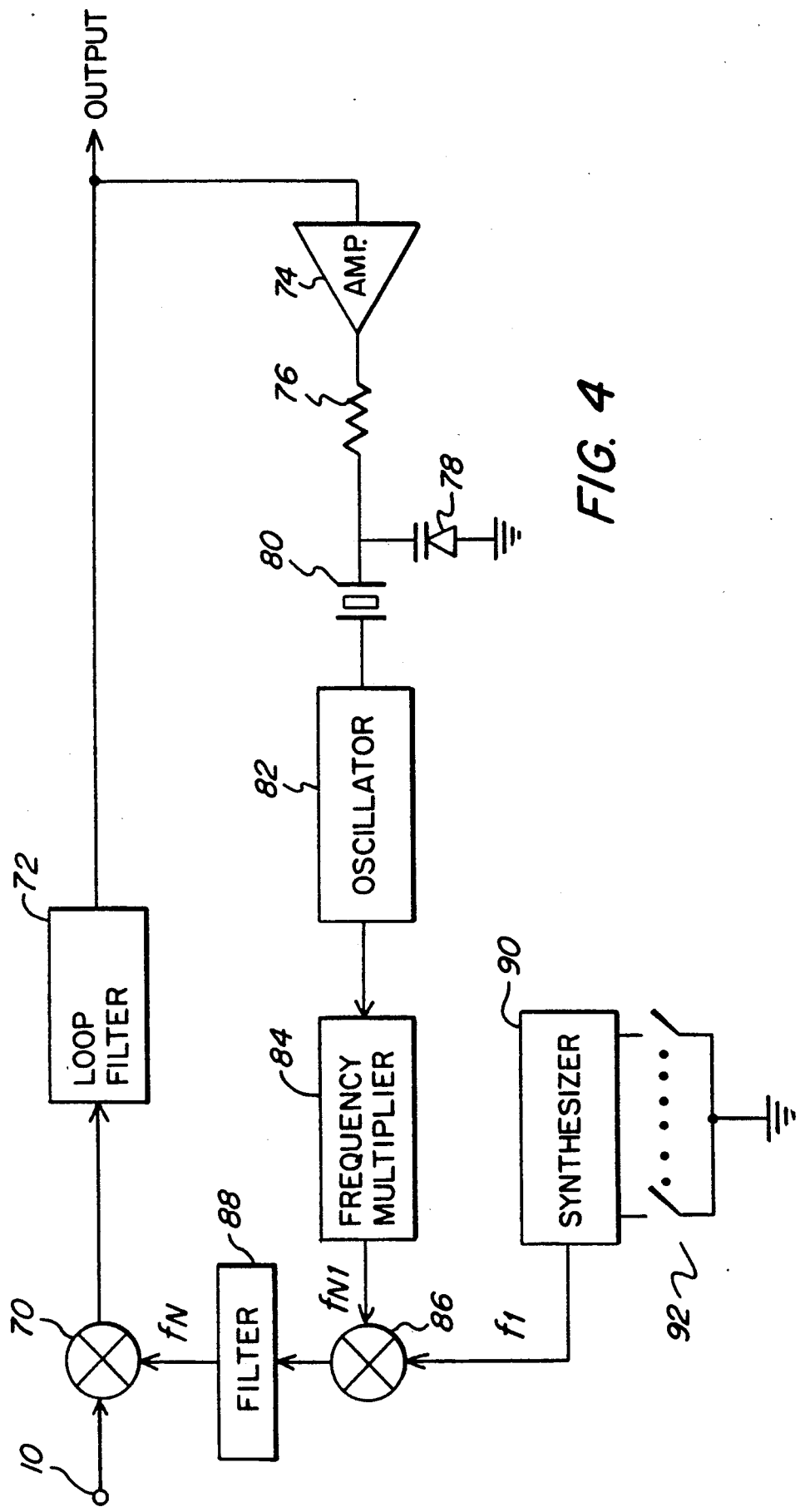
FIG. 4 is a block diagram of another embodiment of an agile FM demodulator in accordance with the present invention.

In the embodiment of FIG. 4, phase detector 70, loop filter 72, amplifier 74, resistor 76, varactor 78, and crystal 80 are equivalent to the corresponding components in FIGS. 2 and 3. Oscillator 82 and frequency multiplier 84 are equivalent to oscillator 42 and frequency multiplier 44 of FIG. 2. The output $f_{N1}$ of frequency multiplier 84 is applied to one input of a mixer 86. The other input of mixer 86 is coupled to receive a frequency $f_1$ from a frequency synthesizer 90. Switches 92 are provided in combination with synthesizer 90 to select one of a plurality of frequencies to be output from the synthesizer. The output of mixer 86 is $f_1 \pm f_{N1}$. A filter 88 selects $f_N = f_1 + f_{N1}$ or $f_N = f_1 - f_{N1}$. The result is that the mixing frequency $f_N$ input to phase detector 70 has a fixed maximum deviation ($f_{N1}$ max. $- f_{N1}$ min.) regardless of the specific frequency $f_1$ established by synthesizer 90.

The circuit of FIG. 4 provides the advantages of the embodiments of each of FIGS. 2 and 3. By providing a fixed frequency multiplier 84 in the PLL, the limited pulling range of a VCXO is scaled to provide a specific deviation required. This deviation remains fixed regardless of the specific channel frequency being detected by the demodulator. Tuning of a specific channel is accomplished using frequency synthesizer 90.

It should be appreciated that although the embodiment of FIG. 4 illustrates a frequency multiplier and oscillator in the PLL, these components can be replaced with a frequency synthesizer. Other frequency sources can also be used, as long as a precise and stable output frequency is provided. Examples include voltage controlled SAW (surface acoustic wave) resonators and voltage controlled ceramic resonators.

It will now be appreciated that the present invention provides an on channel demodulator particularly adapted for use in recovering FM modulated signals carried on a cable television system or the like. By using a precise and stable oscillator having a limited pulling capability in combination with a frequency multiplier, the demodulator can be economically designed to cover a desired deviation without the possibility of locking onto an adjacent undesired channel.

Although the invention has been described in connection with several specific embodiments thereof, those skilled in the art will appreciate that numerous adaptations and modifications can be made thereto without departing from the spirit and scope of the invention as set forth in the following claims.

What is claimed is:

1. A phase lock loop FM demodulator comprising:
   a phase detector having a first input for receiving a and of FM signals containing a signal to be demodulated, a second input for receiving a mixing frequency, and an output;
   voltage controlled crystal oscillator means for providing a precise and stable output frequency variable over a limited range in response to a control signal derived from said phase detector output; and
   frequency multiplier means for multiplying said oscillator frequency by a selected multiplication factor to produce said mixing frequency;
   wherein said multiplication factor scales said limited range to produce a proportionate mixing frequency deviation for FM demodulating said signal.

2. A phase lock loop demodulator comprising:
   a phase detector having a first input for receiving a signal to be demodulated, a second input for receiving a mixing frequency, and an output;
   oscillator means for providing a precise and stable output frequency variable over a limited range in response to a control signal derived from said phase detector output; and frequency multiplier means providing a plurality of selectable multiplication factor for multiplying said oscillator frequency by a selected multiplication factor to produce said mixing frequency;

wherein said multiplication factor scales said limited range to produce a proportionate mixing frequency deviation.

3. The demodulator of claim 2 wherein said frequency multiplier comprises a frequency synthesizer.

4. The demodulator of claim 2 wherein said multiplication factor is chosen to produce the mixing frequency necessary to translate a channel signal received at said first input to baseband.

5. The demodulator of claim 4 further comprising a low pass filter coupled to filter the output of said phase detector.

6. The demodulator of claim 5 further comprising an amplifier for amplifying the filtered phase detector output to provide said control signal.

7. The demodulator of claim 2 wherein said oscillator means comprise a voltage controlled crystal oscillator.

8. The demodulator of claim 2 wherein said oscillator means comprise a voltage controlled SAW resonator.

9. The demodulator of claim 2 wherein said oscillator means comprise a voltage controlled ceramic resonator.

10. A frequency agile phase lock loop demodulator comprising:
    a phase detector having a first input for receiving a signal, a second input for receiving a mixing frequency, and an output;
    oscillator means for providing a precise and stable output frequency variable over a limited range in response to a control signal derived from said phase detector output;
    a mixer having a first input coupled to receive an oscillator signal produced by said oscillator means, a second input, and an output coupled to the second input of said phase detector; and
    frequency synthesizer means for providing a selected frequency to the second input of said mixer.

11. The demodulator of claim 10 wherein said frequency synthesizer means provide a plurality of selectable output frequencies.

12. The demodulator of claim 10 further comprising:
    frequency multiplier means coupled between said oscillator means and said first mixer input for multiplying the oscillator output frequency by a multiplication factor.

13. The demodulator of claim 12 wherein said frequency multiplier means provides a fixed multiplication factor.

14. The demodulator of claim 13 wherein said frequency synthesizer means provide a plurality of selectable output frequencies.

15. The demodulator of claim 14 further comprising means for selecting a synthesizer output frequency to translate a desired channel signal received at said first phase detector input to baseband.

16. The demodulator of claim 15 further comprising a low pass filter coupled to filter the output of said phase detector.

17. The demodulator of claim 16 further comprising an amplifier for amplifying the filtered phase detector output to provide said control signal.

18. The demodulator of claim 17 further comprising filter means coupled to the output of said mixer for providing a filtered mixing frequency to the second phase detector input.

19. The demodulator of claim 10 further comprising filter means coupled to the output of said mixer for providing a filtered mixing frequency to the second phase detector input.

20. The demodulator of claim 19 further comprising:
    a low pass filter coupled to filter the output of said phase detector; and
    an amplifier for amplifying the filtered phase detector output to provide said control signal.

* * * * *

UNITED STATES PATENT AND TRADEMARK OFFICE
CERTIFICATE OF CORRECTION

PATENT NO. : 5,036,291
DATED : July 30, 1991
INVENTOR(S) : Daniel Marz

It is certified that error appears in the above-identified patent and that said Letters Patent is hereby corrected as shown below:

In Claim 1, column 4, line 50, "and of FM signals" should read -- band of FM signals -- .

In Claim 2, column 5, line 4, "factor" should read -- factors -- .

Signed and Sealed this

First Day of December, 1992

*Attest:*

DOUGLAS B. COMER

*Attesting Officer*  Acting Commissioner of Patents and Trademarks